(12) United States Patent
Cai et al.

(10) Patent No.: US 12,087,797 B2
(45) Date of Patent: Sep. 10, 2024

(54) IMAGE SENSOR STRUCTURE

(71) Applicant: Illumina, Inc., San Diego, CA (US)

(72) Inventors: Xiuyu Cai, San Diego, CA (US); Ali Agah, Menlo Park, CA (US); Tracy H. Fung, Redwood City, CA (US); Dietrich Dehlinger, San Francisco, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 18/175,836

(22) Filed: Feb. 28, 2023

(65) Prior Publication Data
US 2023/0207601 A1    Jun. 29, 2023

Related U.S. Application Data

(60) Continuation of application No. 17/119,909, filed on Dec. 11, 2020, now Pat. No. 11,610,928, which is a
(Continued)

(30) Foreign Application Priority Data

Mar. 19, 2018    (NL) ...................................... 2020615

(51) Int. Cl.
*H01L 27/146* (2006.01)
*G01J 1/02* (2006.01)
(Continued)

(52) U.S. Cl.
CPC ...... *H01L 27/14636* (2013.01); *G01J 1/0209* (2013.01); *G01J 1/0214* (2013.01);
(Continued)

(58) Field of Classification Search
CPC ......... H01L 27/14601; H01L 27/14609; H01L 27/1462; H01L 27/14625; H01L 27/14629;
(Continued)

(56) References Cited

U.S. PATENT DOCUMENTS 5,846,708 A    12/1998 Hollis et al.
8,530,266 B1    9/2013 Chen et al.
(Continued)

FOREIGN PATENT DOCUMENTS

JP    2014036037    2/2014
JP    2017504789    2/2017
(Continued)

*Primary Examiner* — Fazli Erdem
(74) *Attorney, Agent, or Firm* — Illumina, Inc.

(57) ABSTRACT

An example image sensor structure includes an image layer. The image layer includes an array of light detectors disposed therein. A device stack is disposed over the image layer. An array of light guides is disposed in the device stack. Each light guide is associated with at least one light detector of the array of light detectors. A passivation stack is disposed over the device stack. The passivation stack includes a bottom surface in direct contact with a top surface of the light guides. An array of nanowells is disposed in a top layer of the passivation stack. Each nanowell is associated with a light guide of the array of light guides. A crosstalk blocking metal structure is disposed in the passivation stack. The crosstalk blocking metal structure reduces crosstalk within the passivation stack.

18 Claims, 16 Drawing Sheets

Related U.S. Application Data division of application No. 16/208,862, filed on Dec. 4, 2018, now Pat. No. 10,879,296.

(60) Provisional application No. 62/610,354, filed on Dec. 26, 2017.

(51) Int. Cl.
  *G01J 1/44* (2006.01)
  *G01N 21/05* (2006.01)
  *G01N 21/64* (2006.01)

(52) U.S. Cl.
  CPC ............ *G01J 1/44* (2013.01); *G01N 21/6454* (2013.01); *H01L 27/14601* (2013.01); *H01L 27/14609* (2013.01); *H01L 27/1462* (2013.01); *H01L 27/14625* (2013.01); *H01L 27/14629* (2013.01); *H01L 27/14643* (2013.01); *G01N 21/05* (2013.01); *G01N 2201/0642* (2013.01); *H01L 27/14623* (2013.01)

(58) Field of Classification Search
  CPC ........... H01L 27/1463; H01L 27/14636; H01L 27/14643; G01J 1/44
  USPC ........................................................ 257/414
  See application file for complete search history.

(56) References Cited

U.S. PATENT DOCUMENTS

| | | |
|---|---|---|
| 9,130,072 B1 | 9/2015 | Chen et al. |
| 9,373,732 B2 | 6/2016 | Velichko et al. |
| 9,704,898 B2 | 7/2017 | Chung et al. |
| 9,842,870 B2 | 12/2017 | Chung et al. |
| 10,879,296 B2 | 12/2020 | Cai et al. |
| 2009/0095968 A1 | 4/2009 | Baek et al. |
| 2009/0200622 A1 | 8/2009 | Tai et al. |
| 2010/0038740 A1 | 2/2010 | Fereyre et al. |
| 2012/0021525 A1 | 1/2012 | Fehr et al. |
| 2012/0156100 A1 | 6/2012 | Tsai et al. |
| 2013/0285181 A1* | 10/2013 | Lin .................. H01L 27/1463 257/E31.127 |
| 2014/0044390 A1 | 2/2014 | Naruse |
| 2014/0078359 A1 | 3/2014 | Enchenkov et al. |
| 2014/0264701 A1 | 9/2014 | Tai et al. |
| 2015/0056097 A1 | 2/2015 | Vaartstra |
| 2015/0079596 A1 | 3/2015 | Eltoukhy et al. |
| 2015/0192735 A1 | 7/2015 | Ellis-Monaghan et al. |
| 2016/0041095 A1 | 2/2016 | Rothberg et al. |
| 2016/0356715 A1* | 12/2016 | Zhong ............... H01L 27/14623 |
| 2017/0016830 A1 | 1/2017 | Chung et al. |
| 2017/0168234 A1 | 6/2017 | Shi et al. |
| 2017/0322156 A1 | 11/2017 | Saxena et al. |

FOREIGN PATENT DOCUMENTS

| | | |
|---|---|---|
| KR | 20140111932 | 9/2014 |
| KR | 20160096644 | 8/2016 |
| RU | 105744 | 6/2011 |
| TW | 201618291 | 5/2016 |
| TW | 201702575 | 1/2017 |

* cited by examiner

IMAGE SENSOR STRUCTURE

CROSS-REFERENCE TO RELATED APPLICATIONS

This application is a continuation of U.S. patent application Ser. No. 17/119,909, filed on Dec. 11, 2020, which is a divisional of U.S. patent application Ser. No. 16/208,862, filed on Dec. 4, 2018, now U.S. patent Ser. No. 10/879,296, issued Dec. 29, 2020, which claims priority to U.S. Provisional Patent Application No. 62/610,354, filed Dec. 26, 2017 and Dutch Application No. 2020615, filed on Mar. 19, 2018, the entire contents of which are incorporated herein by reference.

BACKGROUND

Image sensor structures may be coupled with such microfluidic devices as flow cells to form a sensor system. The sensor system may be, for example, a biosensor system. Such sensor systems often utilize high density arrays of nanowells disposed in a top layer of a passivation stack of layers (herein the "passivation stack") of the image sensor structure to perform controlled reaction protocols on analytes disposed within the nanowells.

In an example of such a reaction protocol, analytes (such as clusters of DNA segments, nucleic-acid molecular chains, or the like) that are disposed in a nanowell array of an image sensor structure may be tagged with an identifiable label (such as a fluorescently labeled molecule) that is delivered to the analytes via fluid flow through a flow cell. One or more excitation lights may then be directed onto the labeled analytes within the nanowells. The analytes may then emit photons of an emissive light, which may be transmitted through the passivation stack and into light guides of the image sensor structure that are associated (e.g., located directly below) with each nanowell.

A top surface of each light guide is in direct contact with the bottom surface of the passivation stack, wherein each light guide's top surface receives a significant portion of the emissive light photons transmitted from its associated nanowell. The light guides direct the emissive light photons to light detectors disposed within the image sensor structure and associated (e.g., located directly below) with the light guides. The light detectors detect the emissive light photons. Device circuitry within the image sensor structure then processes and transmits data signals using those detected photons. The data signals may then be analyzed to reveal properties of the analytes. Examples of such reaction protocols include high-throughput DNA sequencing for the health and pharmaceutical industries and more.

As the need for increasing the throughput of reaction protocols continuously grows, so does the need to continuously reduce the size of nanowells in nanowell arrays in an image sensor structure and, therefore, increase the number of nanowells in the nanowell arrays. As pitch (i.e., the distance between repetitive structures in a semiconductor structure) between rows of nanowells in an array becomes increasing smaller, crosstalk becomes an increasingly significant factor.

Crosstalk includes emissive light that is transmitted from a nanowell, through the passivation stack, and into a neighboring unassociated light guide and detected by an unassociated light detector. Crosstalk contributes to the noise level of the data signals that are processed from the light detectors and its associated device circuitry. Under some circumstances, for some ranges of pitches of nanowell rows (e.g., a range of about 1.5 microns or less, or a range of about 1.0 microns or less) crosstalk may become a dominating factor in noise contribution. In addition, nanowell size (diameter) is often reduced to accommodate tighter pitch. As a result, the total number of analytes in each nanowell (and consequently the total available emissive signal from each well) is reduced, further compounding the effect of noise such as crosstalk.

Accordingly, there is a need to reduce crosstalk transmitted within an image sensor structure. More specifically, there is a need to reduce crosstalk of an image sensor structure that is transmitted from a nanowell, through the passivation stack of an image sensor structure, and into the top surfaces of light guides that are not associated with the nanowell. Additionally, there is a need to reduce such crosstalk transmitted through a passivation stack before it enters the light guides. Also, there is a need to reduce crosstalk of image sensor structures wherein the pitch between rows of nanowells is about 1.5 microns or less.

BRIEF DESCRIPTION

The present disclosure offers advantages and alternatives over the prior art by providing an image sensor structure having crosstalk blocking metal structures disposed in the passivation stack. The crosstalk blocking metal structures may include pillars or parallel metal plates. By being disposed within the passivation structure, the crosstalk blocking metal structures significantly reduce crosstalk transmitted within the passivation layer and prior to entering top surfaces of light guides of the image sensor structure.

An image sensor structure in accordance with one or more aspects of the present disclosure includes an image layer. The image layer includes an array of light detectors disposed therein. A device stack is disposed over the image layer. An array of light guides is disposed in the device stack. Each light guide is associated with at least one light detector of the array of light detectors. A passivation stack is disposed over the device stack. The passivation stack includes a bottom surface in direct contact with a top surface of the light guides. An array of nanowells is disposed in a top layer of the passivation stack. Each nanowell is associated with a light guide of the array of light guides. A crosstalk blocking metal structure is disposed in the passivation stack. The crosstalk blocking metal structure reduces crosstalk within the passivation stack.

Another image sensor structure in accordance with one or more aspects of the present disclosure includes an image layer. The image layer includes an array of light detectors disposed therein. A device stack is disposed over the image layer. An array of light guides is disposed in the device stack. Each light guide is associated with at least one light detector of the array of light detectors. A passivation stack is disposed over the device stack. The passivation stack includes a $1^{st}$ passivation layer having a bottom surface in direct contact with a top surface of the light guides. The passivation stack also includes a $1^{st}$ chemical protection layer disposed over the $1^{st}$ passivation layer. The passivation stack also includes a $2^{nd}$ passivation layer disposed over the $1^{st}$ chemical protection layer and a $2^{nd}$ chemical protection layer disposed over the $2^{nd}$ passivation layer. An array of nanowells is disposed in a top layer of the passivation stack. Each nanowell is associated with a light guide of the array of light guides.

A method of forming an image sensor structure in accordance with one of more aspects of the present disclosure includes disposing a device stack over an image layer. The image layer includes an array of light detectors disposed therein. An array of light guide apertures is etched into the device stack. An array of light guides is formed in the light guide apertures. Each light guide is associated with at least one light detector of the array of light detectors. A $1^{st}$ passivation layer is disposed over the array of light guides, such that a bottom surface of the $1^{st}$ passivation layer is in direct contact with a top surface of the light guides. A $1^{st}$ chemical protection layer is disposed over the $1^{st}$ passivation layer. The $1^{st}$ chemical protection layer and $1^{st}$ passivation layer are included in a passivation stack. An array of nanowells is formed in a top layer of the passivation stack. Each nanowell is associated with a light guide of the array of light guides. A crosstalk blocking metal structure is disposed within the passivation stack. The crosstalk blocking metal structure reduces crosstalk within the passivation stack.

BRIEF DESCRIPTION OF DRAWINGS

The disclosure will be more fully understood from the following detailed description taken in conjunction with the accompanying drawings, in which.

DETAILED DESCRIPTION

Certain examples will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms "substantially", "approximately", "about", "relatively" or other such similar terms that may be used throughout this disclosure, including the claims, are used to describe and account for small fluctuations, such as due to variations in processing. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Examples provided herein relate to image sensor structures and methods of making the same. More specifically, examples provided herein relate to image sensor structures having crosstalk blocking metal structures disposed within a passivation stack of the image sensor structures.

Figure 1:
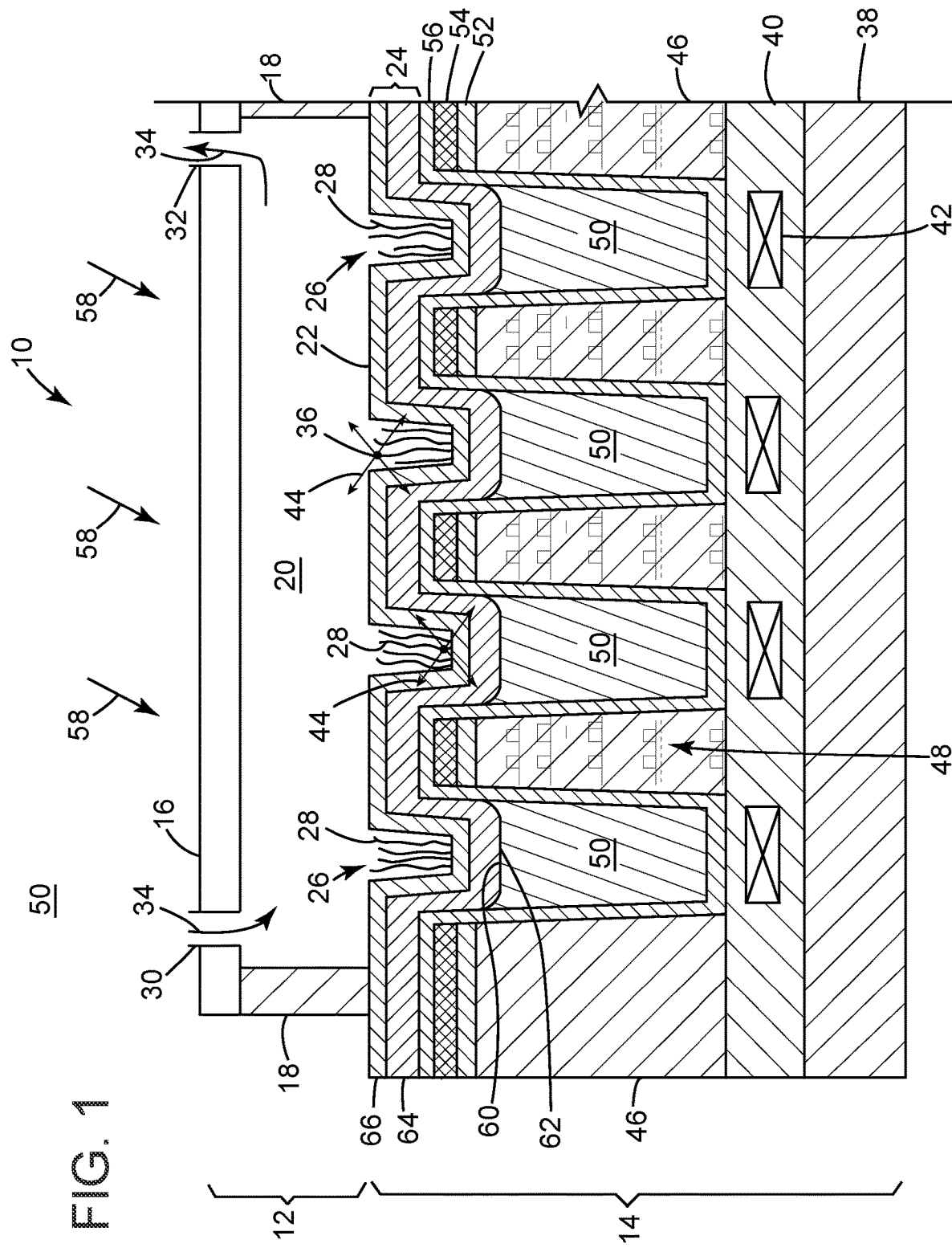
FIG. 1 is a simplified cross sectional side view of a sensor system having an image sensor structure disposed therein.

FIG. 1 illustrates a sensor system having one type of image sensor structure disposed therein. FIGS. 2-5 illustrate various examples of image sensor structures in accordance with the present disclosure. FIGS. 6-16 illustrate various examples of methods of making image sensor structures in accordance with the present disclosure.

Referring to FIG. 1, an example sensor system 10 (which, in this example, is a biosensor system 10) includes a flow cell 12 bonded to an image sensor structure 14. The flow cell 12 of the biosensor system 10 includes a flow cell cover 16 affixed to flow cell sidewalls 18. The flow cell sidewalls 18 are bonded to a top layer 22 of a passivation stack 24 of the image sensor structure 14 to form a flow channel 20 therebetween.

The top layer 22 of the passivation stack 24 includes a large array of nanowells 26 disposed thereon. Analytes 28 (such as DNA segments, oligonucleotides, other nucleic-acid chains or the like) may be disposed within the nanowells 26. The flow cell cover includes an inlet port 30 and an outlet port 32 that are sized to allow fluid flow 34 into, through and out of the flow channels 20. The fluid flow 34 may be utilized to perform a large number of various controlled reaction protocols on the analytes 28 disposed within the nanowells 26. The fluid flow 34 may also deliver an identifiable label 36 (such as a fluorescently labeled nucleotide molecule or the like) that can be used to tag the analytes 28.

The image sensor structure 14 of the biosensor 10 includes an image layer 40 disposed over a base substrate 38. The image layer 38 may be a dielectric layer, such as SiN and may contain an array of light detectors 42 disposed therein. A light detector 42 as used herein may be, for example, a semiconductor, such as a photodiode, a complementary metal oxide semiconductor (CMOS) material, or both. The light detectors 42 detect light photons of emissive light 44 that is emitted from the fluorescent labels 36 attached to the analytes 28 in the nanowells 26. The base substrate 38 may be glass, silicon or other like material.

A device stack 46 is disposed over the image layer 40. The device stack 46 may contain a plurality of dielectric layers (not shown) that contain various device circuitry 48 which interfaces with the light detectors 42 and process data signals using the detected light photons.

Also disposed in the device stack 46 is an array of light guides 50. Each light guide 50 is associated with at least one light detector 42 of the array of light detectors. For example, the light guide 50 may be located directly over its associated light detector. The light guides 50 direct photons of emissive light 44 from the fluorescent labels 36 on the analytes 28 disposed in the nanowells 26 to their associated light detectors 42.

Also disposed within the device stack 46, is a light shield layer 52, an anti-reflective layer 54 and a protective liner layer 56. The protective liner layer 56, may be composed of a silicon nitride (SiN) and lines the inside walls of the light guides 50. The light shield layer 52, may be composed of tungsten (W) and attenuates emissive light 44 and excitation light 58 transmitted into the device stack 46. The anti-reflective layer 54, may be composed of silicon oxynitride (SiON) and be used for photolithographic patterning of a metal layer underneath.

The passivation stack 24 is disposed over the device stack 46. The passivation stack 24 includes a bottom surface 60 that is in direct contact with a top surface 62 of the light guides 50. The passivation stack 24, may include a passivation layer 64 and a chemical protection layer 66 (which in this case is the top layer 22 of the passivation stack 24). The passivation layer 64, may be composed of SiN and include the bottom surface 60 of the passivation stack 24. The chemical protection layer 66, may be composed of a tantalum pentoxide ($Ta_2O_5$) and may be the top layer 22 of the passivation stack 24.

The array of nanowells 26 is also disposed in the top layer 22 of the passivation stack 24, wherein each nanowell 26 is associated with a light guide 50 of the array of light guides. For example, each nanowell 26 may be located directly above an associated light guide 50, such that most of the photons of emissive light 44 that enters the top surface 62 of each light guide 50 is generated from within that light guide's associated nanowell 26.

During operation, various types of excitation light 58 is radiated onto the analytes 28 in the nanowells 26, causing the labeled molecules 36 to fluoresce emissive light 44. The majority of photons of emissive light 44 may be transmitted through the passivation stack 24 and enter the top surface 62 of its associate light guide 50. The light guides 50 may filter out most of the excitation light 58 and direct the emissive light 44 to an associated light detector 42 located directly below the light guide 50.

The light detectors 42 detect the emissive light photons. The device circuitry 48 within the device stack 46 then process and transmits data signal using those detected photons. The data signal may then be analyzed to reveal properties of the analytes.

However, some photons of emissive light from one nanowell may be inadvertently transmitted through the passivation stack 24 to a neighboring unassociated light guide 50 to be detected as unwanted crosstalk (or crosstalk emissive light) in an unassociated light detector 42. This crosstalk contributes to noise in the data signals.

For image sensor structures 14 having small pitches between rows of nanaowells (for example, nanowells with a pitch of about 1.5 microns or smaller, or more so with a pitch of about 1.25 microns or smaller, and even more so with a pitch of about 1 micron or smaller) such crosstalk may significantly increase noise levels associated with the data signals. In addition, nanowell size (diameter) is often reduced to accommodate tighter pitch. As a result, the total number of analytes in each nanowell (and consequently the total available emissive signal from each well) is reduced, further compounding the effect of noise such as crosstalk. Therefore, the more an image sensor structure is scaled down, the more desirable it becomes to reduce crosstalk that is transmitted within the passivation stack 24.

The example sensor systems described herein differ from some pre-existing sensor systems in several aspects. For example, in one contrasting example, crosstalk shields (not shown) are disposed in its device stack 46, which is located below its passivation stack 24. In this contrasting example, the crosstalk shields are used to reduce crosstalk that leaks out of its light guide 50 and is transmitted through its device stack 46 to another light guide 50. These crosstalk shields do not reduce crosstalk that is transmitted through its passivation stack 24 and into the top surface 62 of its light guides 50. The crosstalk shields of this contrasting example are different from the examples provided herein.

Figure 2:
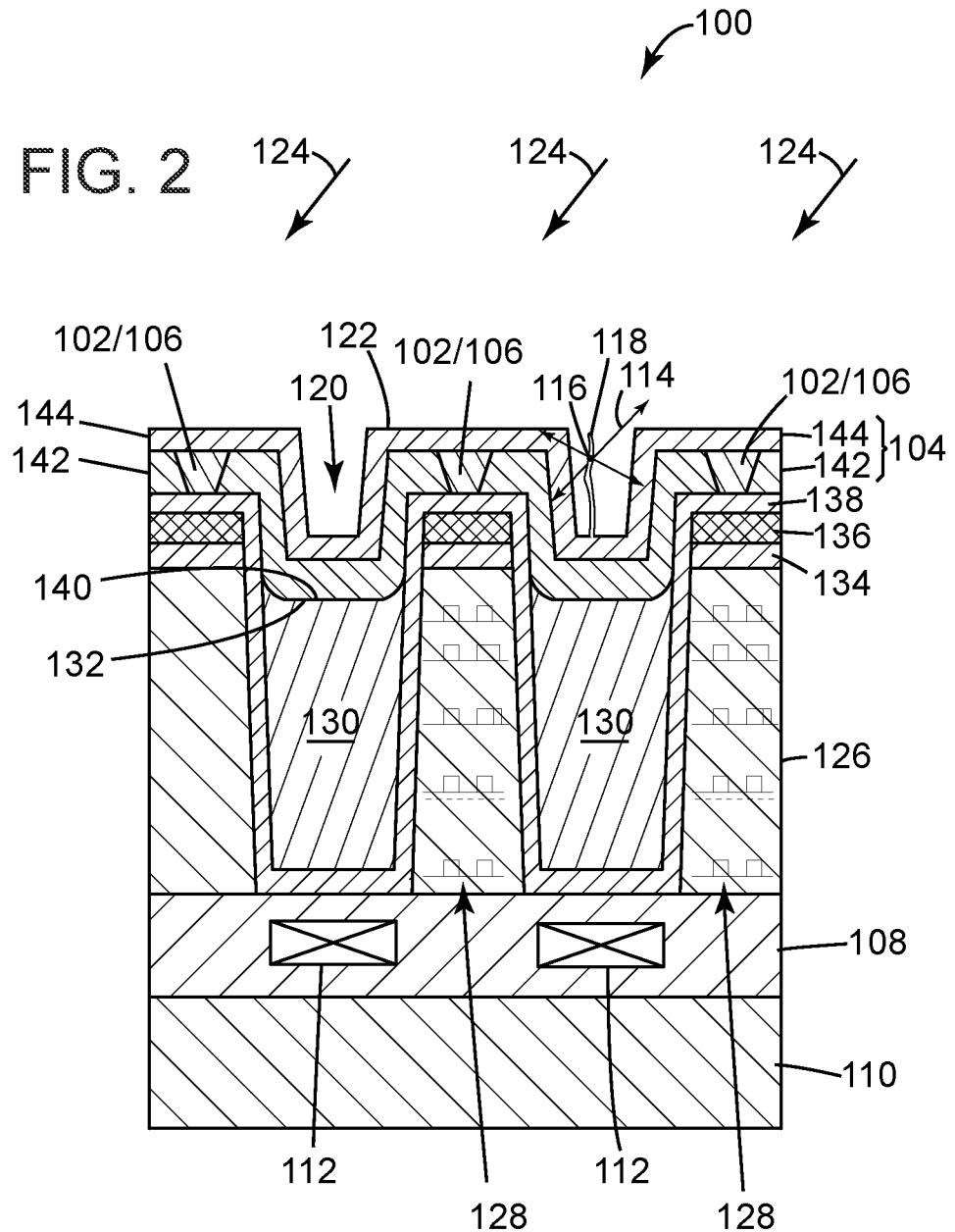
FIG. 2 is a simplified cross sectional side view of an image sensor structure having crosstalk blocking metal structures in the form of pillars in a passivation stack in accordance with one example described herein.

Referring to FIG. 2, a cross-sectional side view of an example of an image sensor structure 100 having crosstalk blocking metal structures 102 in a passivation stack 104 of the image sensor structure 100 is illustrated. The crosstalk blocking metal structures 102 may be any appropriate shape, but in this example, they are in the form of metal pillars 106. The term "pillar", as used herein, includes structures that extend from a bottom surface to a top surface of a layer in a passivation stack. For example, the metal pillars 106 in FIG. 2 extend from the bottom surface 140 of the $1^{st}$ passivation layer 142 to a top surface of the $1^{st}$ passivation layer 142 within passivation stack 104.

The image sensor structure 100 may be bonded to a flow cell to form a sensor system similar to that of the sensor system 10 in FIG. 1. The sensor system may be, for example, a biosensor system.

The image sensor structure 100 includes an image layer 108 disposed over a base substrate 110. The base substrate 110 may comprise glass or silicon. The image layer 108 may comprise a dielectric layer, such as SiN.

An array of light detectors 112 is disposed within the image layer 108. A light detector 112 as used herein may be, for example, a semiconductor, such as a photodiode, a complementary metal oxide semiconductor (CMOS) material, or both. The light detectors 112 detect light photons of emissive light 114 that are emitted from fluorescent labels 116 attached to analytes 118 in nanowells 120 disposed in a top layer 122 of the passivation stack 104. The fluorescent labels 116 are made to fluoresce by an excitation light 124 during various controlled reaction protocols.

A device stack 126 is disposed over the image layer. The device stack 126 may contain a plurality of dielectric layers (not shown) that contain various device circuitry 128 which interfaces with the light detectors 112 and process data signals using the detected light photons of emissive light 114.

Also disposed in the device stack 126 is an array of light guides 130. Each light guide 130 is associated with at least one light detector 112 of the array of light detectors. For example, a light guide 130 may be located directly over its associated light detector 112. The light guides 130 direct photons of emissive light 114 from the fluorescent labels 116 on the analytes 118 disposed in the nanowells 120 to their associated light detectors 112.

In this example, also disposed within the device stack 126, is a light shield layer 134, an anti-reflective layer 136 and a protective liner layer 138. The protective liner layer 138, may be composed of a dielectric material, such as silicon nitride (SiN) or other similar materials, and lines the inside walls of the light guides 130. The light shield layer 134, may be composed of a transition material, such as tungsten (W) or other similar materials, and attenuates emissive light 114 and excitation light 124 transmitted into the device stack 126. The anti-reflective layer 136, may be composed of an anti-reflective compound, such as silicon oxynitride (SiON), or other similar materials and used for photolithographic patterning of a metal layer underneath.

The passivation stack 104 is disposed over the device stack 126. The passivation stack 104 includes a bottom surface 140 that is in direct contact with the top surface 132 of the light guides 130. The passivation stack 104, may include any number of layers of material appropriate to transmit emissive light 114. However, in this example, the passivation stack 104 includes a first ($1^{st}$) passivation layer 142 and a $1^{st}$ chemical protection layer 144. The $1^{st}$ passivation layer 142, may be composed of SiN and include the bottom surface 140 of the passivation stack 104. The $1^{st}$ chemical protection layer 144, may be composed of a transition metal oxide, such as tantalum pentoxide ($Ta_2O_5$) or other similar materials, and be the top layer 122 of the passivation stack 104.

An array of nanowells 120 is also disposed in the top layer 122 of the passivation stack 104, wherein each nanowell 120 is associated with a light guide 130 of the array of light guides. For example, each nanowell 120 may be located directly above an associated light guide 130, such that most of the photons of emissive light 114 that enters the top surface 132 of each light guide 130 is generated from within that light guide's associated nanowell 120.

The crosstalk blocking metal structures 102 are disposed in the passivation stack 104, wherein the crosstalk blocking metal structures 102 may reduce crosstalk within the passivation stack 104. The crosstalk blocking metal structures 102 may be any appropriate shape, but in this example, they are in the form of metal pillars 106. The crosstalk blocking metal structures 102 may be disposed in any appropriate location within the passivation stack 104, but in this example, they are disposed solely in the $1^{st}$ passivation stack 142 and between the nanowells 120. The crosstalk blocking metal structure 102 may be composed of such metals as, for example, tantalum (Ta), tungsten (W), aluminum (Al) or copper (Cu).

The crosstalk blocking metal structures 102 may reduce crosstalk that is transmitted through the passivation stack 104 by any appropriate process. For example, the crosstalk blocking metal structures 102 may be composed of a material that absorbs the emissive light or blocks the emissive light at a given emissive light frequency. Alternatively, the crosstalk blocking metal structures 102 may have a geometric shape and placement within the passivation stack 104 that enables the crosstalk blocking metal structures 102 to direct emissive light 114 away from the top surfaces 140 of the light guides 130.

During operation each nanowell 120 receives analytes 118 that are tagged with a fluorescent molecular label 116, which generates emissive light 114 in response to an excitation light 124. Photons of the emissive light 114 are transmitted from a nanowell 120, through the passivation stack, and into the top surface 140 of an associated light guide 130, which may be located directly below the nanowell 120. The photons of emissive light 114 are then guided by the associated light guide 130 to an associated light detector 112, which may be located directly below the light guide 130. The associated light detectors 112 detect the photons of emissive light 114. Additionally, device circuitry 128 is integrated with the light detectors 112 to process the detected emissive light photons and provide data signals using the detected emissive light photons.

Simultaneously with the processing of such data signals, the crosstalk blocking metal structures 102 may significantly reduce the number of photons of emissive light 114 that may become crosstalk. The reduction may be at least about 5% (e.g., at least about 20%, 30%, 40%, 50%, 60%, or more). In more examples, the reduction is between about 5% to about 50%, such as between 10% and 30%. Other values are also possible. In one example, the crosstalk blocking metal structures 102 reduce the number of emissive light photons that may otherwise be transmitted from a nanowell 120 to an unassociated neighboring light guide 130 and detected by an unassociated light detector 120 as crosstalk. Since such crosstalk may contribute to the noise level of the data signals, the noise level of the data signals is significantly reduced.

Figure 3:
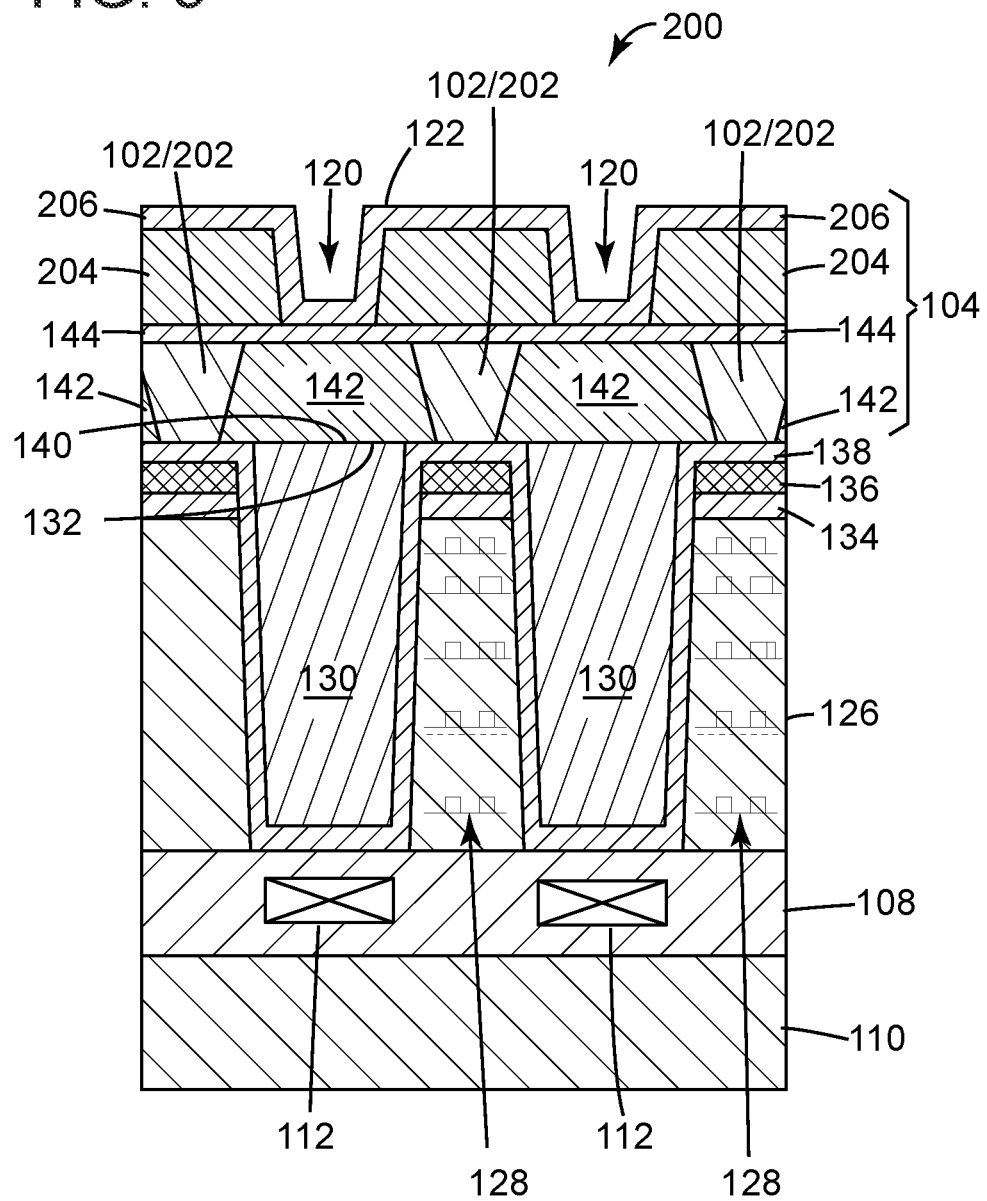
FIG. 3 is a simplified cross sectional side view of an image sensor structure having crosstalk blocking metal structures in the form of pillars in accordance with one example described herein.

Referring to FIG. 3, a cross-sectional side view of another example of an image sensor structure 200 having crosstalk blocking metal structures 102 in the form of pillars 202 is illustrated. The image sensor structure 200 is similar to image sensor structure 100 wherein like features have been labeled with like reference numbers.

The passivation stack 104 of image sensor structure 200 includes four layers. Those four layers include:
 The $1^{st}$ passivation layer 142 being disposed over the light guides 130.
 The $1^{st}$ chemical protection layer 144 being disposed over the $1^{st}$ passivation layer 142.
 A $2^{nd}$ passivation layer 204 being disposed over the $1^{st}$ chemical protection layer 144.
 A $2^{nd}$ chemical protection layer 206 being disposed over the $2^{nd}$ passivation layer 204.

The four layers 142, 144, 204, 206 of the passivation stack 104 (i.e., a four layer passivation stack) of image sensor structure 200, and in subsequent image sensor structures 300 and 400, may provide certain advantages over the two layers 142, 144 of the passivation stack 104 (i.e., a two layer passivation stack) of image sensor 100. Those advantages may include, without limitation:

The four layer passivation stack enables the deposition of larger and more geometrically complex crosstalk blocking metal structures, which may reduce crosstalk more effectively than the crosstalk blocking metal structures that can be disposed in a two layer passivation stack.

The four layer passivation stack enables more flexibility in nanowell design since the nanowell geometry will be less constrained by the light guide structure underneath, due to the added layers.

The four layer passivation stack provides more robustness from any chemical or mechanical damage, due to the increase of the passivation stack thickness as well as the added layer.

In this example, the bottom surface 140 of the $1^{st}$ passivation layer 142 is still the bottom surface of the passivation stack 104 and is in direct contact with the top surface 132 of the light guides 130. However, the top layer 122 of the passivation stack 104 is now the $2^{nd}$ chemical protection layer 206. Additionally, the nanowells 120 are disposed in the $2^{nd}$ chemical protection layer 206.

The composition of the $2^{nd}$ passivation layer 204 and $2^{nd}$ chemical protection layer 206 may be the same as, or similar to, the composition of the $1^{st}$ passivation layer 142 and the $1^{st}$ chemical protection layer 144 respectively. For example, the $2^{nd}$ passivation layer 204 may be composed of SiN and $2^{nd}$ chemical protection layer 206, may be composed of a tantalum pentoxide ($Ta_2O_5$).

The crosstalk blocking metal structure 102 of image sensor structure 200 includes the metal pillars 202. The metal pillars 202 are disposed in the $1^{st}$ passivation layer 104 and are located between the nanowells 120.

Figure 4:
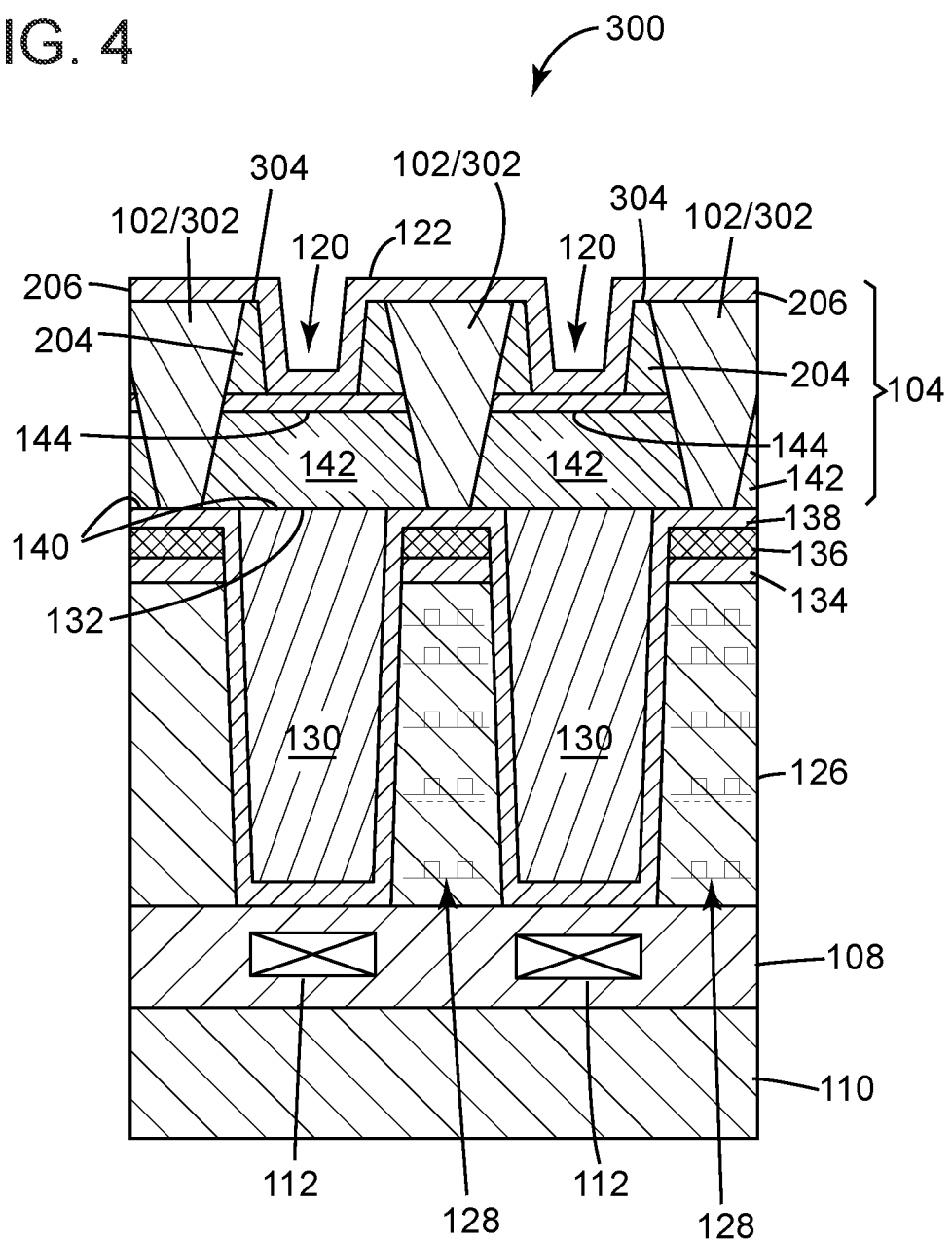
FIG. 4 is a simplified cross sectional side view of an image sensor structure having crosstalk blocking metal structures in the form of pillars in accordance with one example described herein.

Referring to FIG. 4, a cross-sectional side view of another example of an image sensor structure 300 having crosstalk blocking metal structures 102 in the form of pillars 202 is illustrated. The image sensor structure 300 is similar to image sensor structures 100 and 200 wherein like features have been labeled with like reference numbers.

The passivation stack 104 of image sensor structure 300 is the same as, or similar to, the passivation stack of image sensor structure 200 and also includes four layers. Those four layers include:

The $1^{st}$ passivation layer 142 being disposed over the light guides 130.

The $1^{st}$ chemical protection layer 144 being disposed over the $1^{st}$ passivation layer 142.

The $2^{nd}$ passivation layer 204 being disposed over the $1^{st}$ chemical protection layer 144.

The $2^{nd}$ chemical protection layer 206 being disposed over the $2^{nd}$ passivation layer 204.

In this example, the bottom surface 140 of the $1^{st}$ passivation layer 142 is still the bottom surface of the passivation stack 104 and is in direct contact with the top surface 132 of the light guides 130. Additionally, the top layer 122 of the passivation stack 104 is the $2^{nd}$ chemical protection layer 206. Moreover, the nanowells 120 are disposed in the $2^{nd}$ chemical protection layer 206.

However, the crosstalk blocking metal structure 102 of image sensor structure 300 includes the metal pillars 302. The metal pillars 302 extend from the bottom surface 140 of the $1^{st}$ passivation layer 142 to a top surface 304 of the $2^{nd}$ passivation layer 204. The metal pillars are also disposed between the nanowells 120.

Figure 5:
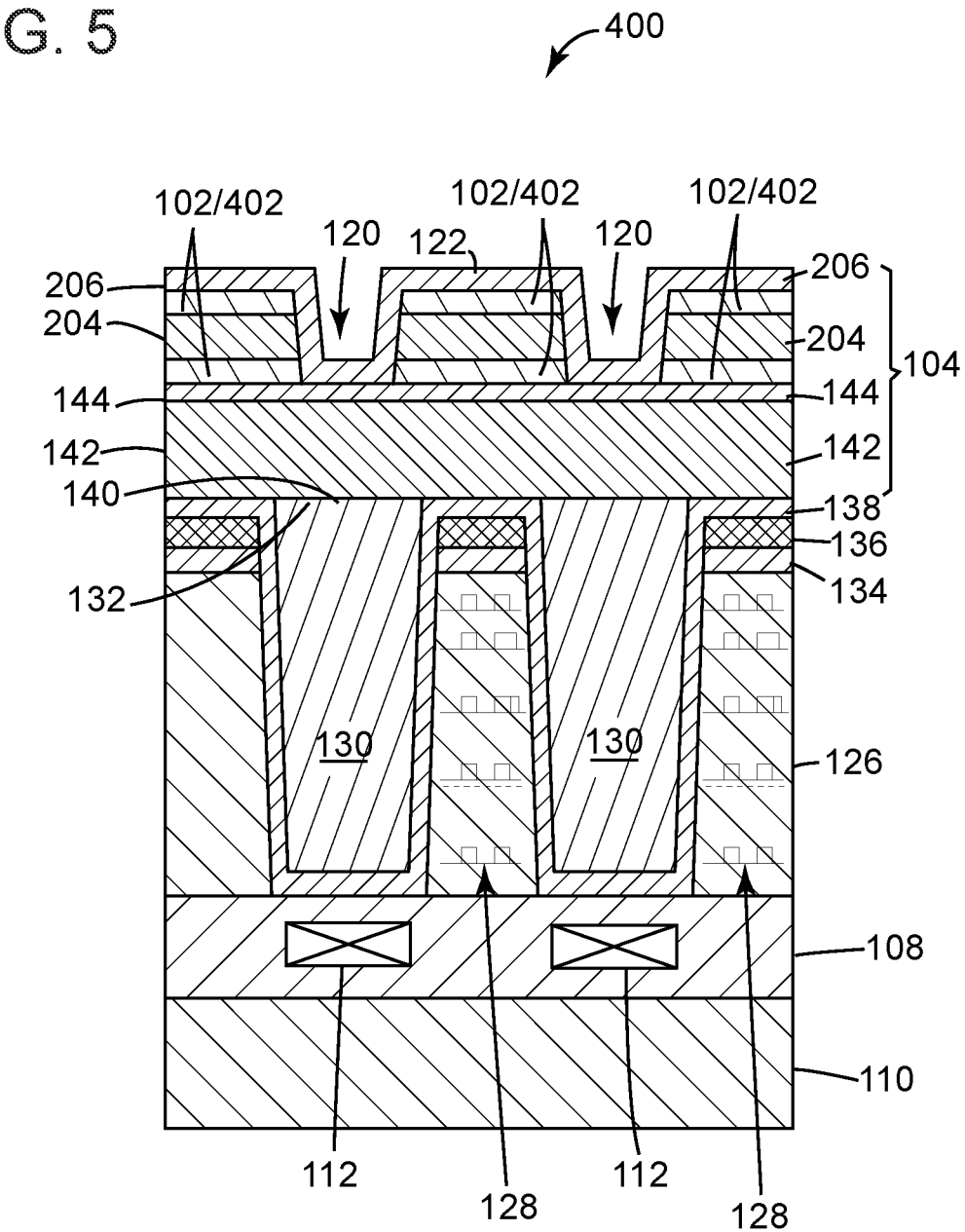
FIG. 5 is a simplified cross sectional side view of an image sensor structure having crosstalk blocking metal structures in the form of parallel metal layers in accordance with one example described herein.

Referring to FIG. 5, a cross-sectional side view of another example of an image sensor structure 400 having crosstalk blocking metal structures 102 in the form of parallel metal layers 402 is illustrated. In this example, there are two parallel metal layers 402A and 402B illustrated. However, depending on design requirements and objectives, there may be more than two such parallel metal layers 402 utilized in image sensor structure 400. The image sensor structure 400 is similar to image sensor structures 100, 200 and 300 wherein like features have been labeled with like reference numbers.

The passivation stack 104 of image sensor structure 400 is the same as, or similar to, the passivation stack of image sensor structure 200 and 300 and also includes four layers. Those four layers include:

The $1^{st}$ passivation layer 142 being disposed over the light guides 130.

The $1^{st}$ chemical protection layer 144 being disposed over the $1^{st}$ passivation layer 142.

The $2^{nd}$ passivation layer 204 being disposed over the $1^{st}$ chemical protection layer 144.

The $2^{nd}$ chemical protection layer 206 being disposed over the $2^{nd}$ passivation layer 204.

In this example, the bottom surface 140 of the $1^{st}$ passivation layer 142 is still the bottom surface of the passivation stack 104 and is in direct contact with the top surface 132 of the light guides 130. Additionally, the top layer 122 of the passivation stack 104 is the $2^{nd}$ chemical protection layer 206. Moreover, the nanowells 120 are disposed in the $2^{nd}$ chemical protection layer 206.

However, the crosstalk blocking metal structure 102 of image sensor structure 400 includes the parallel metal layers 402. In this example, the parallel metal layers 402 are disposed in the $2^{nd}$ passivation layer 204 and between the nanowells 120. However, the parallel metal layers 402 may be disposed in the $1^{st}$ passivation layer 142 and between the nanowells 120 as well.

The geometric shape and placement of the parallel metal layers 402 enable these particular crosstalk blocking metal structures 102 to direct crosstalk emissive light (or crosstalk) in a direction that is relatively parallel to the metal layers 402 and away from unassociated light detectors 112. Additionally, the composition of the parallel metal layers 402 enables these particular crosstalk blocking metal structures 102 to absorb such crosstalk emissive light.

Moreover, there are several other mechanisms that may support crosstalk reduction in the parallel metal layers 402. For example, the parallel metal layers 402A and 402B may absorb crosstalk emissive light due to the separation distance 404 between the parallel metal layers 402A, 402B being smaller than a wavelength of the crosstalk emissive light that is targeted to be blocked or reduced. An example of a specific range of separation distance 404 between the parallel metal layers 402A and 402B for reducing the crosstalk emissive light may be a separation distance 404 that is ½ the wavelength of the crosstalk emissive light or less.

Another example of a mechanism that may support crosstalk reduction in the parallel metal layers 402 may be the width 406 of the metal layers. For example, the parallel metal layers 402A and 402B may absorb crosstalk emissive light due to the width 406 of the parallel metal layers 402A, 402B being ½ the wavelength of the crosstalk emissive light or greater.

Various factors may affect the ranges utilized for the separation distance 404 and width 406 of the parallel metal layers 402 in order to reduce the crosstalk emissive light. Such factors may include the index of refraction of the parallel metal layers 402 and the composition of the material (in this case layer 204) separating the parallel metal layers 402.

Referring to FIGS. 6-15, the following figures illustrate various methods of making the image sensor structures 100, 200, 300 and 400.

Figure 6:
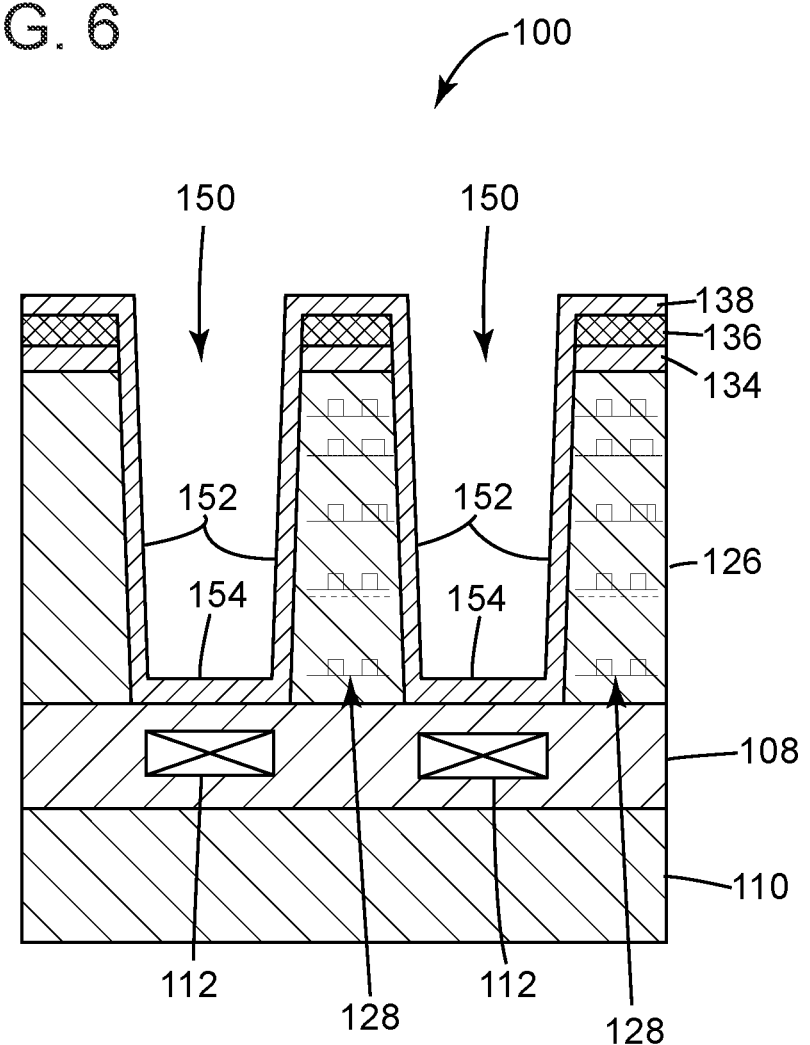
FIG. 6 is a simplified cross sectional side view of an image sensor structure at an intermediate stage of manufacture having light guide apertures disposed in a device stack in accordance with one example described herein.

Referring to FIG. 6, a cross sectional side view of an example of image sensor structure 100 at an intermediate stage of manufacture is illustrated. At this stage of the process flow, the image layer 108 is disposed over the base substrate 110. The image layer includes the array of light detectors 112 disposed therein. The image layer 108 can be disposed over the base substrate 110 using deposition techniques, such as chemical vapor deposition (CVD) or physical vapor deposition (PVD).

The multiple dielectric layers (not shown) of the device stack 126, with its associated device circuitry, can also be disposed over the image layer 108 using deposition techniques. The light shield layer 134 and the anti-reflective layer 136 may thereafter be disposed over the device stack 126 using any suitable deposition techniques, such as CVD, PVD, atomic layer deposition (ALD) or electro-plating.

Thereafter in the process flow, an array of light guide apertures 150 are etched into the device stack. This may be done using any suitable etching processes, such as an anisotropic etching process, such as reactive ion etching (RIE). An etching process in this disclosure may include patterning, such as lithographic patterning.

The protective liner layer 136 can then be disposed over the entire image sensor structure 100, including the sidewalls 152 and bottom 154 of the apertures 150. This may be done using any suitable deposition techniques, such as CVD, PVD or ALD.

Figure 7:
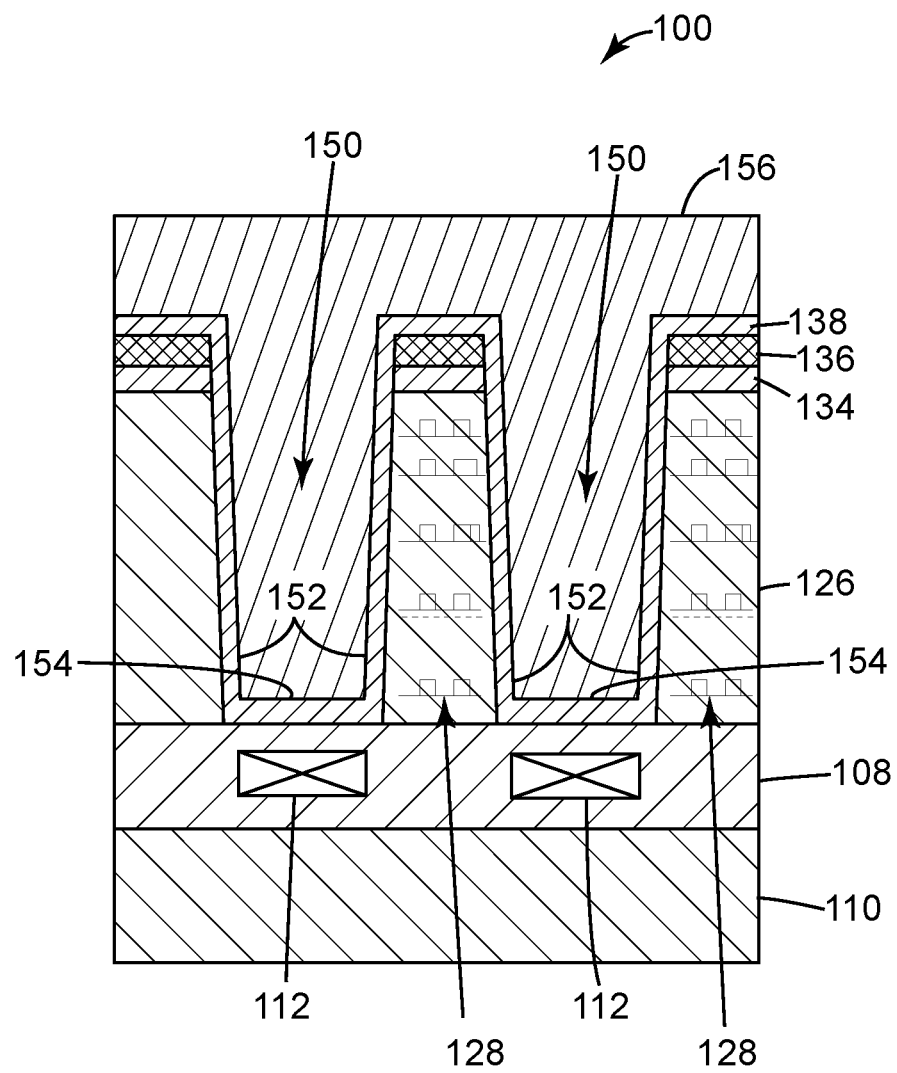
FIG. 7 is a simplified cross sectional side view of the image sensor structure of FIG. 6 having a light guide layer disposed thereon in accordance with one example described herein.

Referring to FIG. 7, thereafter in the process flow, a light guide layer 156 is disposed over the entire structure 100 to fill the apertures 150. The light guide layer may be composed of an organic filter material that is capable of filtering out the known wavelengths of excitation light 124 and transmitting through known wavelengths of emissive light 114. The light guide layer 156 may be composed of custom formulated dye molecules arranged in a high index polymer matrix.

Figure 8:
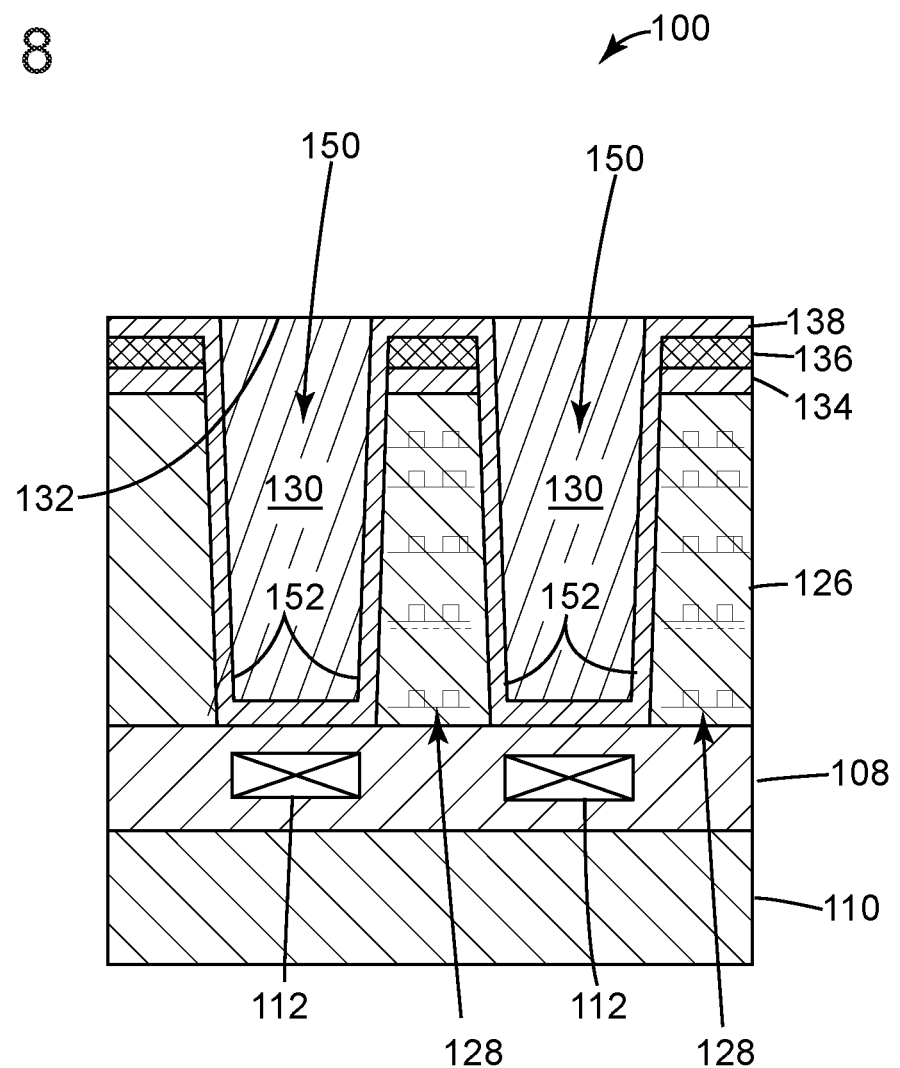
FIG. 8 is a simplified cross-sectional side view of the image sensor structure of FIG. 7, having the light guide layer planarized down to form light guides in accordance with one example described herein.

Referring to FIG. 8, the light guide layer 156 is thereafter planarized down to form the light guides 130, wherein the top surfaces 132 of the light guides 130 are substantially level with the top surface of the protective liner layer 138. This may be done using any suitable polishing technique, such as a chemical mechanical polishing (CMP) process. Once polished down, the overall top surface of the image sensor structure 100 is substantially flat.

Figure 9:
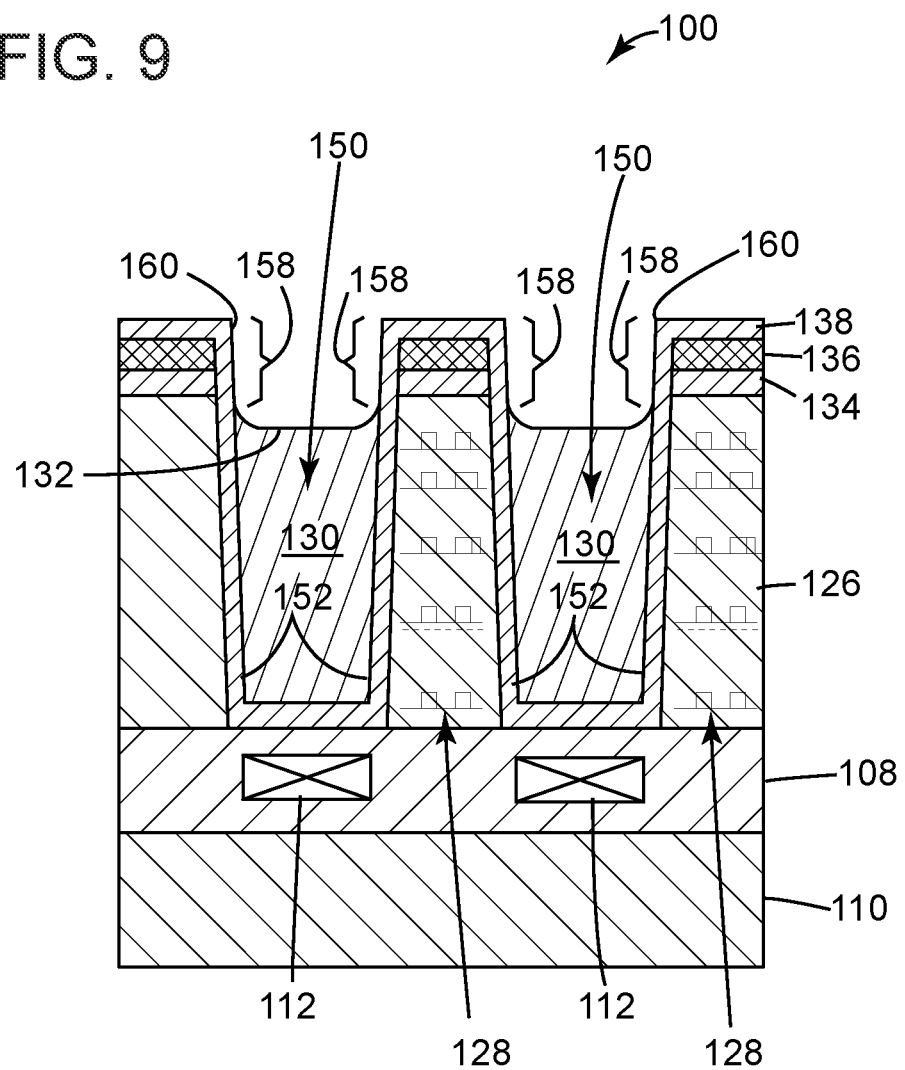
FIG. 9 is a simplified cross sectional side view of the image sensor structure of FIG. 8 having the light guided recessed below a top of the light guide apertures in accordance with one example described herein.

Referring to FIG. 9, the light guides 130 are thereafter recessed down into the light guide apertures 150, wherein each light guide 130 is associated with at least one light detector 112 of the array of light detectors. This can be done with a timed etching process that recesses the light guide layer 156 down at a given rate for a known amount of time. When the etching process is finished, the light guides 130 have been recessed into the light guide apertures 150 such that upper portions 158 of inner side walls 152 of the light guide apertures 150 are exposed. Additionally, the top surfaces 132 of the light guides 130 are recessed to a predetermined depth below a top opening 160 of the light guide apertures 150.

Figure 10:
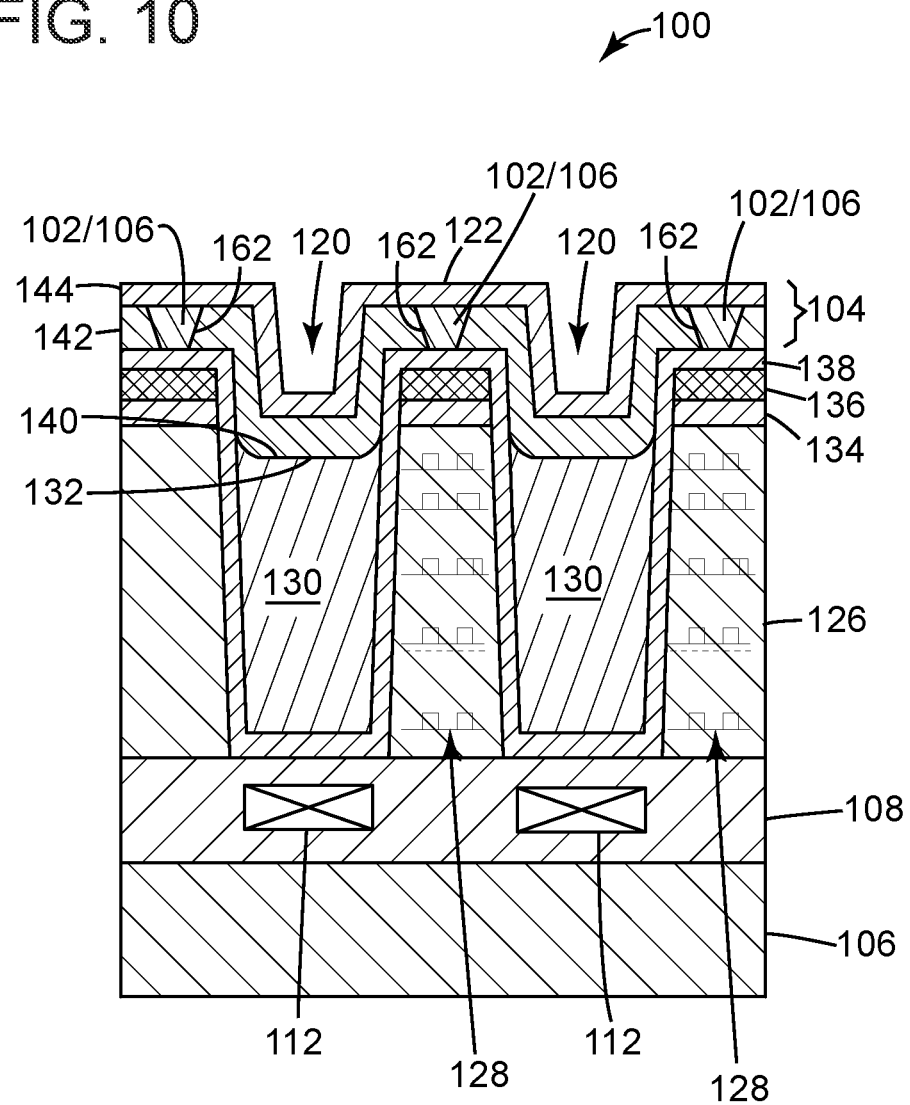
FIG. 10 is a simplified cross sectional side view of the image sensor structure of FIG. 9 having crosstalk blocking metal structures in the form of pillars in a passivation stack, the passivation stack being disposed over a top surface of the light guides to form a completed image sensor structure in accordance with one example described herein.

Referring to FIG. 10, thereafter the $1^{st}$ passivation layer 142 is disposed over the array of light guides 130, such that the bottom surface 140 of the $1^{st}$ passivation layer 142 is in direct contact with the top surface 132 of the light guides 130. The $1^{st}$ chemical protection layer 144 can then be disposed over the $1^{st}$ passivation layer 142. Both of these processes may be done by CVD or PVD. The $1^{st}$ chemical protection layer 144 and $1^{st}$ passivation layer 142 form at least a portion of the passivation stack 104.

The array of nanowells 120 may be formed in the top layer 122 of the passivation stack 104 at an appropriate point in the process flow. Each nanowell 120 is associated with a light guide 130 of the array of light guides.

For the specific example of image sensor structure 100 as illustrated in FIG. 10, the nanowells 120 may be formed by disposing the $1^{st}$ passivation layer 142 such that it conforms to the upper portions 158 of the inner side walls 152 of the light guide apertures 150. This may be done by CVD, PVD or ALD. Accordingly, the contour of the $1^{st}$ passivation layer 142 forms the array of nanowells 120 in the $1^{st}$ passivation layer such that each nanowell is associated, and self-aligned, with a single light guide 130.

Additionally, the crosstalk blocking metal structures 102 can be disposed within the passivation stack 104 at an appropriate point in the process flow. Each crosstalk blocking metal structure 102 may reduce crosstalk within the passivation stack 104.

For the specific example of image sensor structure 100 as illustrated in FIG. 10, the crosstalk blocking structures may be formed as metal pillars 106 by lithographically etching pillar cavities 162 into the $1^{st}$ passivation layer 142 such that the pillar cavities 162 are disposed between the nanowells 120. This may be done by a RIE process.

The metal pillars 106 may then be disposed within the pillar cavities 162. This may be done by a metal plating process. Later any overflow caused by the plating process may be removed by a chemical mechanical polishing (CMP) process.

After deposition of the $1^{st}$ passivation layer 142 and the formation of the metal pillars 106, the $1^{st}$ chemical protection layer 144 may be disposed over the $1^{st}$ passivation layer 142 to complete the formation of image sensor structure 100. The $1^{st}$ chemical protection layer 144 may be disposed using CVD, PVD or ALD.

Figure 11:
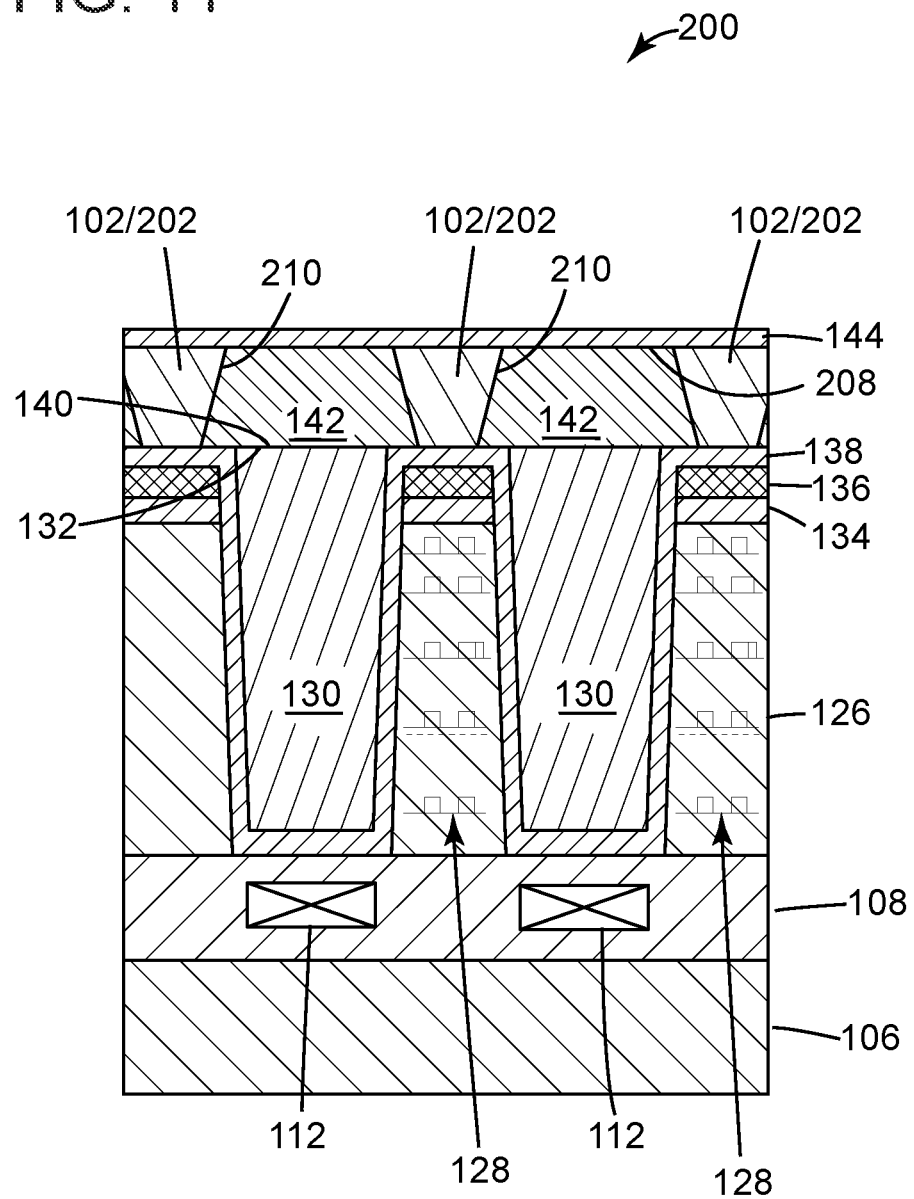
FIG. 11 is a simplified cross sectional side view of an image sensor structure at an intermediate stage of manufacture having crosstalk blocking metal structures in the form of pillars in a partially formed passivation stack in accordance with one example described herein.

Referring to FIG. 11, a cross sectional side view of an example of image sensor structure 200 at an intermediate stage of manufacture is illustrated. This example of the process flow of image sensor structure 200 is the same as, or similar to, the example of the process flow of image sensor 100 up to and including the process flow disclosed with regards to FIG. 8. Therefore, at this stage of the process flow, the top surface 132 of the light guides 130 are substantially level with the top surface of the protective liner layer 138. Therefore, the overall top surface of the image sensor structure 200 is substantially flat.

Thereafter, the $1^{st}$ passivation layer 142 is disposed over the structure 200, such that the bottom surface 140 of the $1^{st}$ passivation layer 142 is in direct contact with the top surface 132 of the light guides 130. This $1^{st}$ passivation layer 142 of structure 200 provides a substantially level upper surface 208 of the $1^{st}$ passivation layer 142. This may be done by CVD or PVD.

The metal pillars 202 (which are the crosstalk blocking metal structures 102 in this example) may then be disposed into the $1^{st}$ passivation layer 142. This can be done by first etching pillar cavities 210 into the $1^{st}$ passivation layer 142. This may be done using a RIE process. The metal pillars 202 may then be disposed within the pillar cavities 210 using CVD, PVD or electro-plating. Any overflow caused by the deposition of the metal pillars 202 into the pillar cavities 210 may later be removed by a chemical mechanical polishing (CMP) process.

Thereafter, the 1$^{st}$ chemical protection layer 144 may be disposed over the relatively flat upper surface 208 of the 1$^{st}$ passivation layer 142. This may be done by CVD, PVD or ALD.

Figure 12:
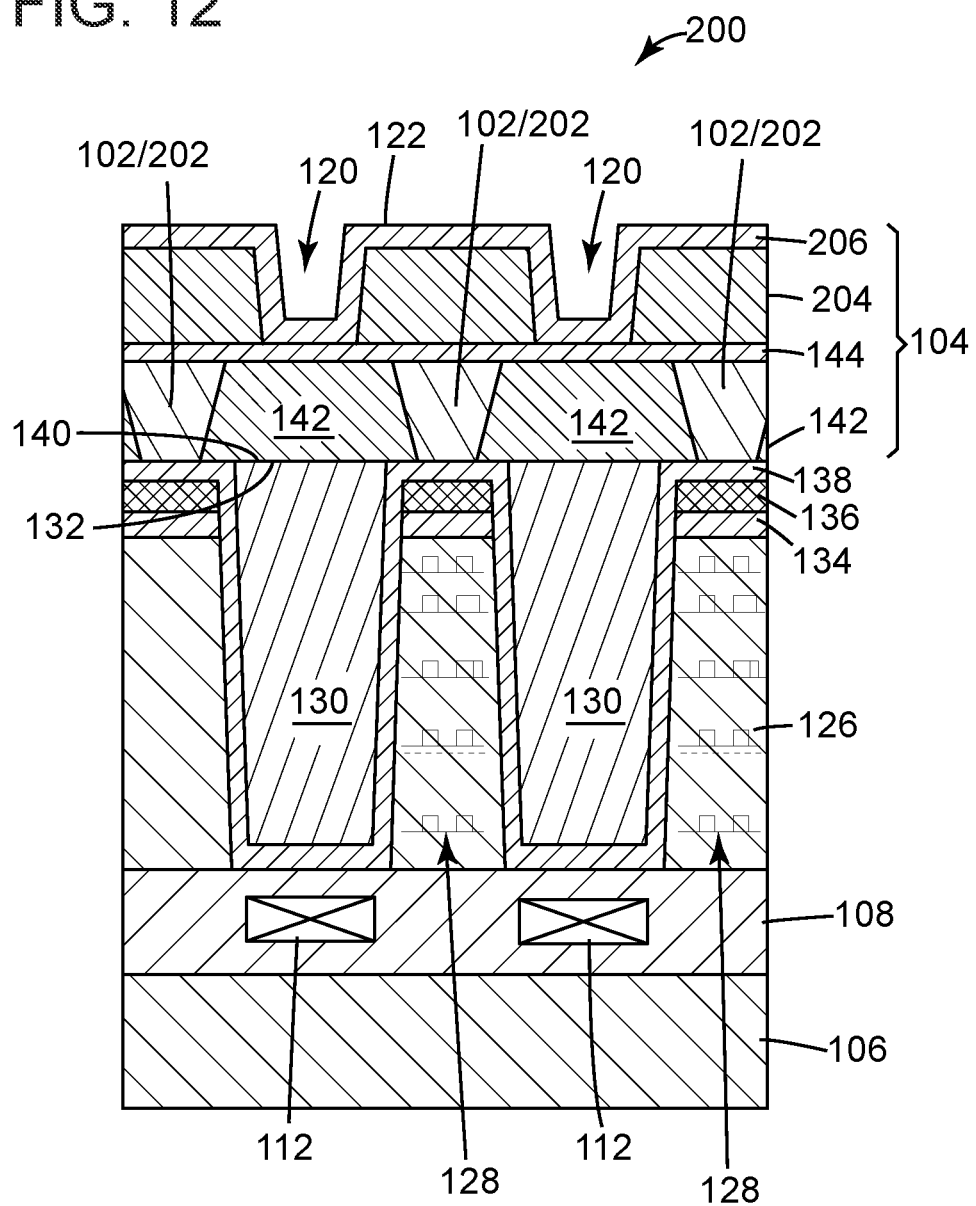
FIG. 12 is a simplified cross sectional side view of the image sensor structure of FIG. 11 having a fully formed passivation stack to form a completed image sensor structure in accordance with one example described herein.

Referring to FIG. 12, thereafter in the process flow, the 2$^{nd}$ passivation layer 204 is disposed over the 1$^{st}$ chemical protection layer 144. This may be done using any suitable deposition technique, such as CVD, PVD or ALD.

Nanowells 120 can then be formed into the 2$^{nd}$ passivation layer 204. This can be done by lithographically patterning and etching the nanowells 120 into the 2$^{nd}$ passivation layer 204.

Thereafter the 2$^{nd}$ chemical protection layer 206 is disposed over the 2$^{nd}$ passivation layer 204 to complete the formation of the image sensor structure 200. This may be done by using any suitable deposition technique, such as CVD, PVD or ALD. The deposition process conforms the 2$^{nd}$ chemical protection layer 206 to the contours of the nanowells 120 in the 2$^{nd}$ passivation layer 204, therefore forming the nanowells 120 in the 2$^{nd}$ chemical protection layer 206. The 2$^{nd}$ chemical protection layer 206, the 2$^{nd}$ passivation layer 204, the 1$^{st}$ chemical protection layer 144 and the 1$^{st}$ passivation layer 142 are all included in the passivation stack 104 of the image sensor structure 200.

Figure 13:
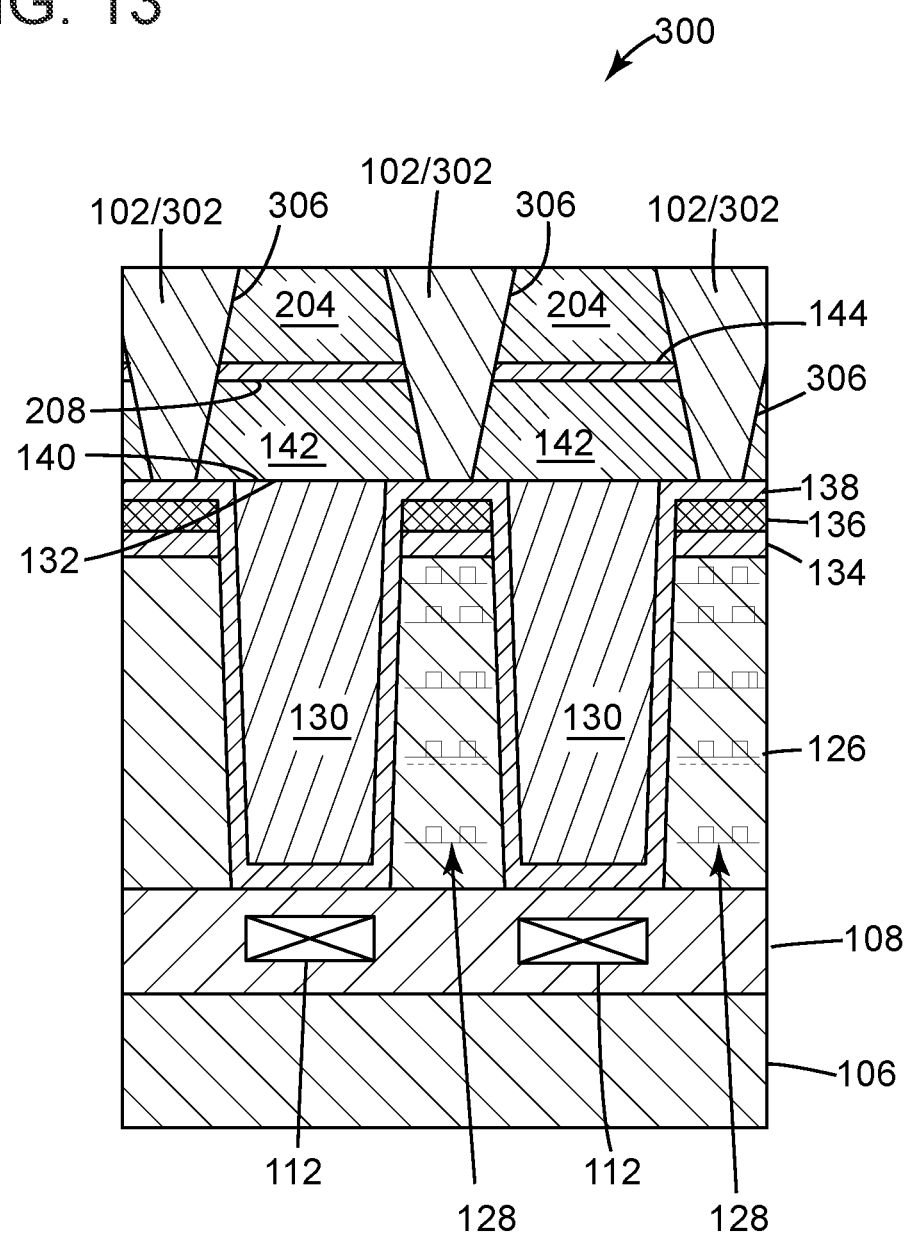
FIG. 13 is a simplified cross sectional side view of an image sensor structure at an intermediate stage of manufacture having crosstalk blocking metal structures in the form of pillars in a partially formed passivation stack in accordance with one example described herein.

Referring to FIG. 13, a cross sectional side view of an example of image sensor structure 300 at an intermediate stage of manufacture is illustrated. This example of the process flow of image sensor structure 300 is the same as, or similar to, the example of the process flow of image sensor 100 up to and including the process flow disclosed with regards to FIG. 8. Therefore, at this stage of the process flow, the top surface 132 of the light guides 130 are at least substantially level with the top surface of the protective liner layer 138. Therefore, the overall top surface of the image sensor structure 300 is substantially flat.

Thereafter, the 1$^{st}$ passivation layer 142 is disposed over the structure 300, such that the bottom surface 140 of the 1$^{st}$ passivation layer 142 is in direct contact with the top surface 132 of the light guides 130. This 1$^{st}$ passivation layer 142 of structure 300 provides a substantially level upper surface 208 of the 1$^{st}$ passivation layer 142. This may be done by using any suitable deposition technique, such as CVD or PVD.

Thereafter, the 1$^{st}$ chemical protection layer 144 may be disposed over the relatively flat upper surface 208 of the 1$^{st}$ passivation layer 142. Then the 2$^{nd}$ passivation layer 204 may be disposed over the 1$^{st}$ chemical protection layer 144. Both of these layers 144, 204 may be disposed using any suitable deposition technique, such as CVD, PVD or ALD.

The metal pillars 302 (which are the crosstalk blocking metal structures 102 of image sensor structure 300) may then be disposed into the 2$^{nd}$ passivation layer 204, the 1$^{st}$ chemical protection layer 144 and the 1$^{st}$ passivation layer 142. This can be done by first etching pillar cavities 306 into the 1$^{st}$ and 2$^{nd}$ passivation layers 142, 204 and into the 1$^{st}$ chemical protection layer 144. This may be done using a RIE process. The metal pillars 302 may then be disposed within the pillar cavities 306 using any suitable deposition technique, such as CVD, PVD or electro-plating. Any overflow caused by the deposition of the metal pillars 302 into the pillar cavities 306 may later be removed by any suitable polishing technique, such as a chemical mechanical polishing (CMP) process.

Figure 14:
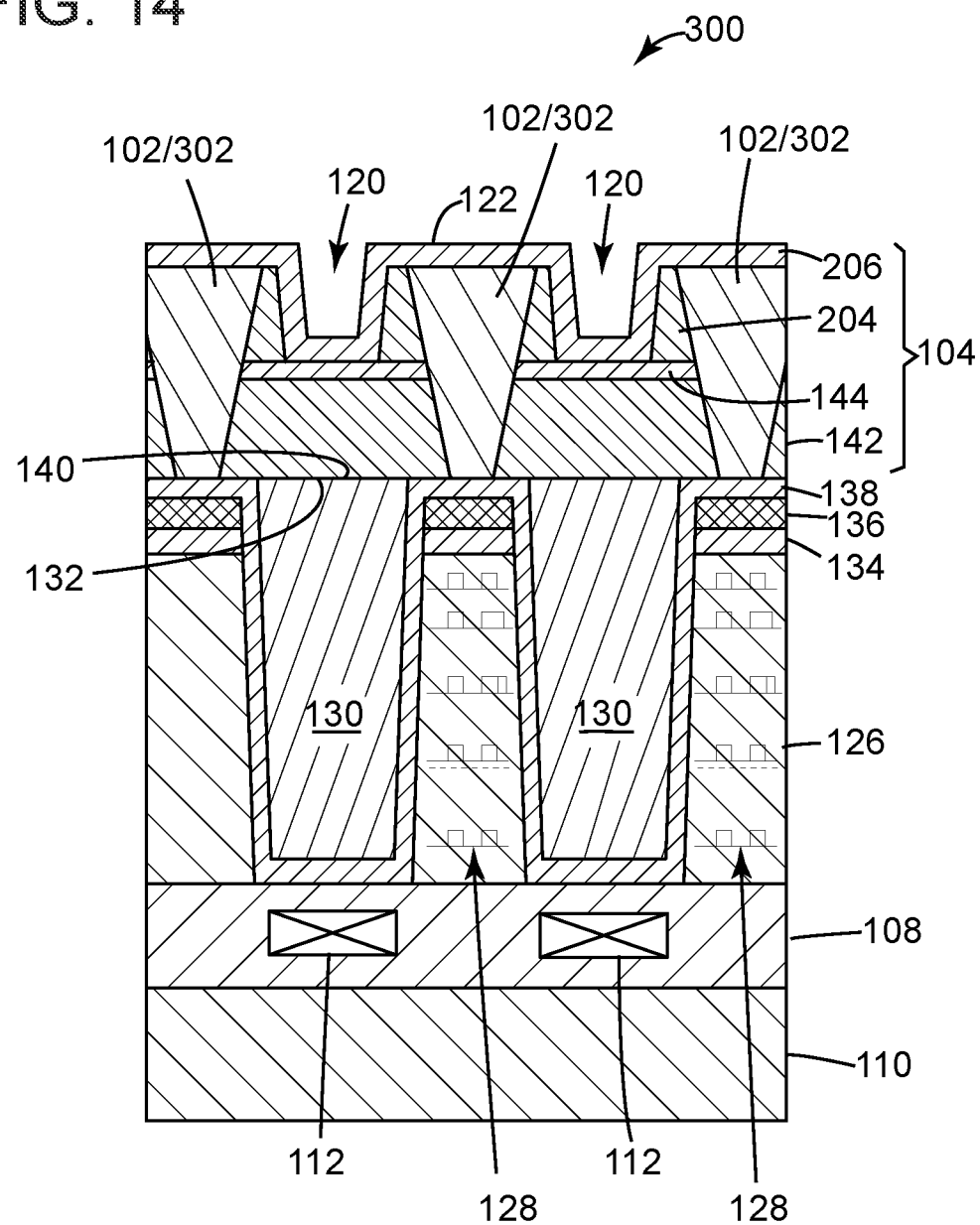
FIG. 14 is a simplified cross sectional side view of the image sensor structure of FIG. 13 having a fully formed passivation stack to form a completed image sensor structure in accordance with one example described herein.

Referring to FIG. 14, thereafter nanowells 120 can then be formed into the 2$^{nd}$ passivation layer 204. This can be done by lithographically patterning and etching the nanowells 120 into the 2$^{nd}$ passivation layer 204.

Thereafter the 2$^{nd}$ chemical protection layer 206 is disposed over the 2$^{nd}$ passivation layer 204 to complete the formation of the image sensor structure 300. This may be done by CVD, PVD or ALD. The deposition process conforms the 2$^{nd}$ chemical protection layer 206 to the contours of the nanowells 120 in the 2$^{nd}$ passivation layer 204, therefore forming the nanowells 120 in the 2$^{nd}$ chemical protection layer 206. The 2$^{nd}$ chemical protection layer 206, the 2$^{nd}$ passivation layer 204, the 1$^{st}$ chemical protection layer 144 and the 1$^{st}$ passivation layer 142 are all included in the passivation stack 104 of the image sensor structure 300.

Figure 15:
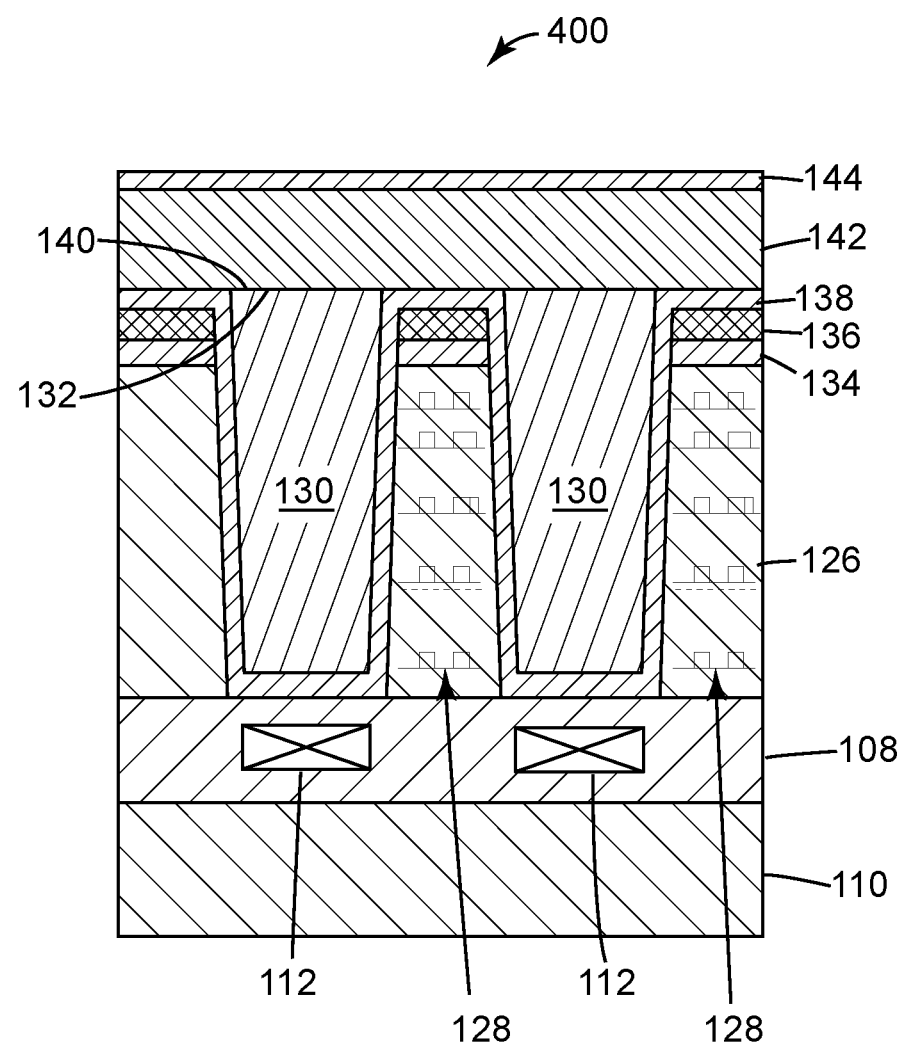
FIG. 15 is a simplified cross sectional side view of an image sensor structure at an intermediate stage of manufacture having a partially formed passivation stack in accordance with one example described herein.

Referring to FIG. 15, a cross sectional side view of an example of image sensor structure 400 at an intermediate stage of manufacture is illustrated. This example of the process flow of image sensor structure 400 is the same as, or similar to, the example of the process flow of image sensor 100 up to and including the process flow disclosed with regards to FIG. 8. Therefore, at this stage of the process flow, the top surface 132 of the light guides 130 are substantially level with the top surface of the protective liner layer 138. Therefore, the overall top surface of the image sensor structure 400 is substantially flat.

Thereafter, the 1$^{st}$ passivation layer 142 is disposed over the structure 400, such that the bottom surface 140 of the 1$^{st}$ passivation layer 142 is in direct contact with the top surface 132 of the light guides 130. This 1$^{st}$ passivation layer 142 of structure 400 provides a substantially level upper surface 208 of the 1$^{st}$ passivation layer 142. This may be done by using any suitable deposition technique, such as CVD or PVD.

Thereafter, the 1$^{st}$ chemical protection layer 144 may be disposed over the relatively flat upper surface 208 of the 1$^{st}$ passivation layer 142. This may be done by using any suitable deposition technique, such as CVD, PVD or ALD.

Figure 16:
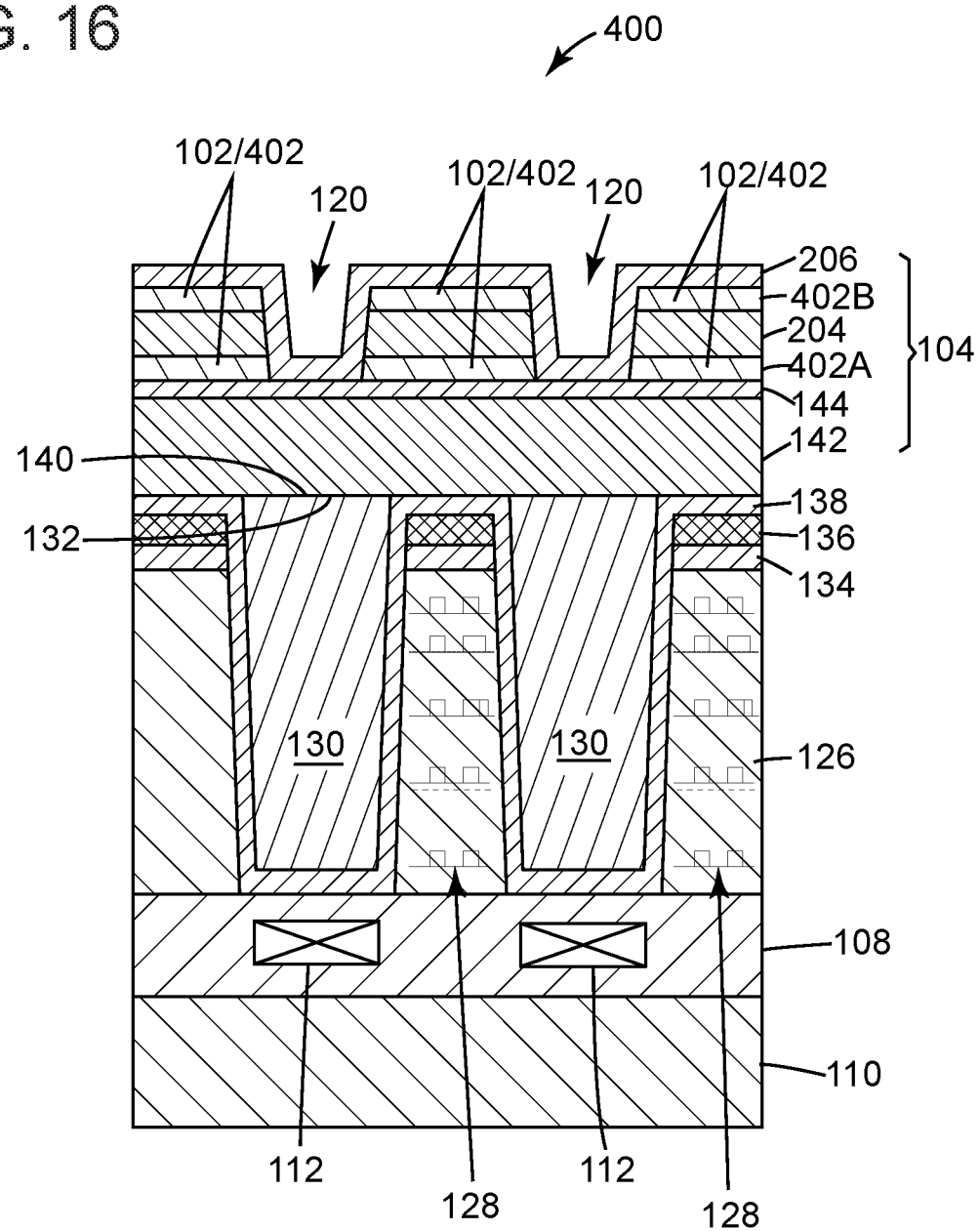
FIG. 16 is a simplified cross sectional side view of the image sensor structure of FIG. 15 having crosstalk blocking metal structures in the form of parallel metal layers in a fully formed passivation stack to form a completed image sensor structure in accordance with one example described herein.

Referring to FIG. 16, thereafter a first parallel metal layer 402A (which is one of the crosstalk blocking metal structures 102 of the image sensor structure 400) may be disposed over the 1$^{st}$ chemical protection layer 144. Metal layer 402A may be disposed by using any suitable deposition technique, such as CVD, PVD, ALD or electro-plating.

Then the 2$^{nd}$ passivation layer 204 may be disposed over the first metal layer 402A. This may be done by using any suitable deposition technique, such as CVC or PVD.

Then a second parallel metal layer 402B may be disposed over the 2$^{nd}$ passivation layer 204 such that it is parallel to the first parallel metal layer 402A. This may be done by using any suitable deposition technique, such as CVD, PVD, ALD or electro-plating.

Thereafter nanowells 120 can then be formed into the 2$^{nd}$ passivation layer 204, and into the parallel metal layers 402A, 402B. This may be done by lithographically patterning and etching the nanowells 120 into the 2$^{nd}$ passivation layer 204 and the parallel metal layers 402A, 402B.

Thereafter the 2$^{nd}$ chemical protection layer 206 is disposed over the 2$^{nd}$ passivation layer 204 to complete the formation of the image sensor structure 400. This may be done by using any suitable deposition technique, such as CVD, PVD or ALD. The deposition process conforms the 2$^{nd}$ chemical protection layer 206 to the contours of the nanowells 120 in the 2$^{nd}$ passivation layer 204, therefore forming the nanowells 120 in the 2$^{nd}$ chemical protection layer 206. The 2$^{nd}$ chemical protection layer 206, the 2$^{nd}$ passivation layer 204, the 1$^{st}$ chemical protection layer 144 and the 1st passivation layer 142 are all included in the passivation stack 104 of the image sensor structure 400.

Thereafter, the image sensor structures 100, 200, 300, 400 may be disposed onto a printed circuit board (not shown). For example, any one of the image sensor structures 100, 200, 300, 400 may be bonded, by using any suitable bonding technique, to a flow cell (like flow cell 12) to form a sensor system (like, for example, biosensor system 10). Thereafter, the sensor system may be bonded, by using any suitable bonding technique, to a printed circuit board. This may be done by, for example, adhesive bonding.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

Although the foregoing examples have been described by reference to specific examples, it should be understood that numerous changes may be made within the spirit and scope of the inventive concepts described. Accordingly, it is intended that the examples not be limited to the described examples, but that it have the full scope defined by the language of the following claims.

The invention claimed is:

1. An image sensor structure, comprising:
   an image layer comprising an array of light detectors disposed therein;
   a device stack disposed over the image layer;
   an array of light guides disposed in the device stack, each light guide associated with at least one light detector of the array of light detectors;
   a passivation stack disposed over the device stack;
   a crosstalk blocking metal structure disposed in the passivation stack, wherein the crosstalk blocking metal structure extends from at least a top surface of a layer and through at least a portion of the layer in the passivation stack, wherein the crosstalk blocking metal structure reduces crosstalk within the passivation stack.

2. The image sensor structure of claim 1, wherein the passivation stack comprises a bottom surface in direct contact with a top surface of the light guides.

3. The image sensor structure of claim 1, further comprising an array of nanowells disposed in a top layer of the passivation stack, each nanowell associated with a light guide of the array of light guides.

4. The image sensor structure of claim 1, wherein the passivation stack comprises a plurality of layers, the plurality of layers comprising a passivation layer disposed over the light guides and a chemical protection layer disposed over the passivation layer.

5. The image sensor structure of claim 1,
   wherein the passivation stack comprises a plurality of layers, the plurality of layers comprising a first (1st) passivation layer disposed over the light guides and a 1st chemical protection layer disposed over the 1st passivation layer.

6. The image sensor structure of claim 5, wherein the plurality of layers further comprises:
   a second (2nd) passivation layer disposed over the 1st chemical protection layer; and
   a 2nd chemical protection layer disposed over the 2nd passivation layer;
   wherein nanowells are disposed in a top layer of the 2nd chemical protection layer.

7. The image sensor structure of claim 5, wherein the 1st passivation layer is composed of a silicon nitride (SiN) and the 1st chemical protection layer is composed of a tantalum pentoxide ($Ta_2O_5$).

8. The image sensor structure of claim 6, wherein the 2nd passivation layer is composed of a silicon nitride (SiN) and the 2nd chemical protection layer is composed of a tantalum pentoxide ($Ta_2O_5$).

9. An image sensor structure, comprising:
   an image layer comprising an array of light detectors disposed therein;
   a device stack disposed over the image layer;
   an array of light guides disposed in the device stack, each light guide associated with at least one light detector of the array of light detectors;
   a passivation stack disposed over the device stack;
   a crosstalk blocking metal structure disposed in the passivation stack, wherein the crosstalk blocking metal structure comprises parallel metal layers, wherein the crosstalk blocking metal structure reduces crosstalk within the passivation stack.

10. The image sensor structure of claim 9, wherein the parallel metal layers have a separation distance between the parallel metal layers that is one half a wavelength of the crosstalk or less.

11. The image sensor structure of claim 9, wherein the parallel metal layers have a width of the parallel metal layers that is one half the wavelength of the crosstalk or greater.

12. The image sensor structure of claim 9, wherein the passivation stack comprises a bottom surface in direct contact with a top surface of the light guides.

13. The image sensor structure of claim 9, further comprising an array of nanowells disposed in a top layer of the passivation stack, each nanowell associated with a light guide of the array of light guides.

14. The image sensor structure of claim 9, wherein the passivation stack comprises a plurality of layers, the plurality of layers comprising a passivation layer disposed over the light guides and a chemical protection layer disposed over the passivation layer.

15. The image sensor structure of claim 9,
   wherein the passivation stack comprises a plurality of layers, the plurality of layers comprising a first (1st) passivation layer disposed over the light guides and a 1st chemical protection layer disposed over the 1st passivation layer.

16. The image sensor structure of claim 15, wherein the plurality of layers further comprises:
   a second (2nd) passivation layer disposed over the 1st chemical protection layer; and
   a 2nd chemical protection layer disposed over the 2nd passivation layer;
   wherein nanowells are disposed in a top layer of the 2nd chemical protection layer.

17. The image sensor structure of claim 15, wherein the 1st passivation layer is composed of a silicon nitride (SiN) and the 1st chemical protection layer is composed of a tantalum pentoxide ($Ta_2O_5$).

18. The image sensor structure of claim 16, wherein the 2nd passivation layer is composed of a silicon nitride (SiN) and the 2nd chemical protection layer is composed of a tantalum pentoxide ($Ta_2O_5$).

* * * * *